United States Patent
Savanth et al.

(10) Patent No.: US 9,985,613 B2
(45) Date of Patent: May 29, 2018

(54) FLIP-FLOP

(71) Applicants: ARM Limited, Cambridge (GB); University of Southampton, Southampton (GB)

(72) Inventors: Anand Savanth, Cambridge (GB); James Edward Myers, Bottisham (GB); Yunpeng Cai, Southampton (GB); Alexander Stewart Weddell, New Milton (GB); Tom Kazmierski, Southampton (GB)

(73) Assignees: ARM Limited, Cambridge (GB); University of Southampton, Southamptonn (GB)

( * ) Notice: Subject to any disclaimer, the term of this patent is extended or adjusted under 35 U.S.C. 154(b) by 0 days. days.

(21) Appl. No.: 15/336,721

(22) Filed: Oct. 27, 2016

(65) Prior Publication Data
US 2018/0123571 A1   May 3, 2018

(51) Int. Cl.
*H03K 3/356* (2006.01)
*H03K 3/3562* (2006.01)
*H03K 19/20* (2006.01)

(52) U.S. Cl.
CPC .......... *H03K 3/35625* (2013.01); *H03K 19/20* (2013.01)

(58) Field of Classification Search
CPC ............................ H03K 3/35625; H03K 19/20
USPC ......................................................... 327/203
See application file for complete search history.

(56) References Cited

U.S. PATENT DOCUMENTS

| | | | | |
|---|---|---|---|---|
| 5,748,522 A | * | 5/1998 | Piguet | H03K 3/037 365/154 |
| 8,570,086 B2 | * | 10/2013 | Hirairi | G11C 19/00 327/212 |
| 2008/0136448 A1 | * | 6/2008 | Ng | G05B 19/045 326/46 |
| 2014/0077855 A1 | * | 3/2014 | Sasagawa | H03K 3/0372 327/203 |

(Continued)

OTHER PUBLICATIONS

Kim, et al.; "27.8 A Static Contention-Free Single-Phase-Clocked 24T Flip-Flop in 45nm for Low-Power Applications"; 2014 IEEE International Solid-State Circuits Conference Digest of Technical Papers (ISSCC), Session 27; pp. 466-468; 2014.

(Continued)

*Primary Examiner* — Ryan Jager
(74) *Attorney, Agent, or Firm* — Pramudji Law Group PLLC; Ari Pramudji

(57) ABSTRACT

A single-phase flip-flop comprising: a master latch comprising: a first circuit to generate a master latch signal in response to a first master logic operation on a flip flop input signal and a first clock signal, and a second circuit to generate a master output signal in response to a second master logic operation on the first clock signal and master latch signal; a slave latch comprising: a third circuit to generate a slave output signal in response to a first slave logic operation on the first clock signal and one of the master output signal and an inverted slave output signal; and wherein the master latch is configured to capture the flip-flop input signal during a first portion of the first clock signal and the slave latch is configured to capture the master output signal during a second portion of the first clock signal.

19 Claims, 11 Drawing Sheets

(56) References Cited

U.S. PATENT DOCUMENTS

| | | | |
|---|---|---|---|
| 2015/0116019 A1* | 4/2015 | Hsu | H03K 3/35625 327/203 |
| 2016/0056801 A1* | 2/2016 | Cai | H03K 3/012 327/203 |
| 2016/0065184 A1* | 3/2016 | Liu | H03K 3/037 327/225 |
| 2016/0094204 A1* | 3/2016 | Nandi | H03K 3/012 327/203 |
| 2016/0241219 A1* | 8/2016 | Kim | G01R 31/3177 |
| 2016/0261252 A1* | 9/2016 | Agarwal | H03K 3/356008 |

OTHER PUBLICATIONS

Kawai, et al.; "A Fully Static Topologically-Compressed 21-Transistor Flip-Flop with 75% Power Saving"; 2013 IEEE Asian Solid-State Circuits Conference (A-SSCC); pp. 117-120; 2013.

Teh, et al.; "A 77% Energy-Saving 22-Transistor Single-Phase-Clocking D-Flip-Flop with Adaptive-Coupling Configuration in 40nm CMOS"; 2011 IEEE International Solid-State Circuits Conference Digest of Technical Papers (ISSCC), Session 19; pp. 338-340; 2011.

Hirata, et al.; "The Cross Charge-Control Flip-Flop: a Low-Power and High-Speed Flip-Flop Suitable for Mobile Application SoCs"; 2005 Symposium on VLSI Circuits Digest of Technical Papers; pp. 306-307; 2005.

Hamada, et al; A Conditional Clocking Flip-Flop for Low Power H.264/MPEG-4 Audio/Visual LSI; IEEE 2005 Custom Integrated Circuits Conference; pp. 527-530; 2005.

Rabaey, et al.; "Digital Integrated Circuits: A Design Perspective"; 2nd edition; Prentice Hall; pp. 432-433; 2002.

* cited by examiner

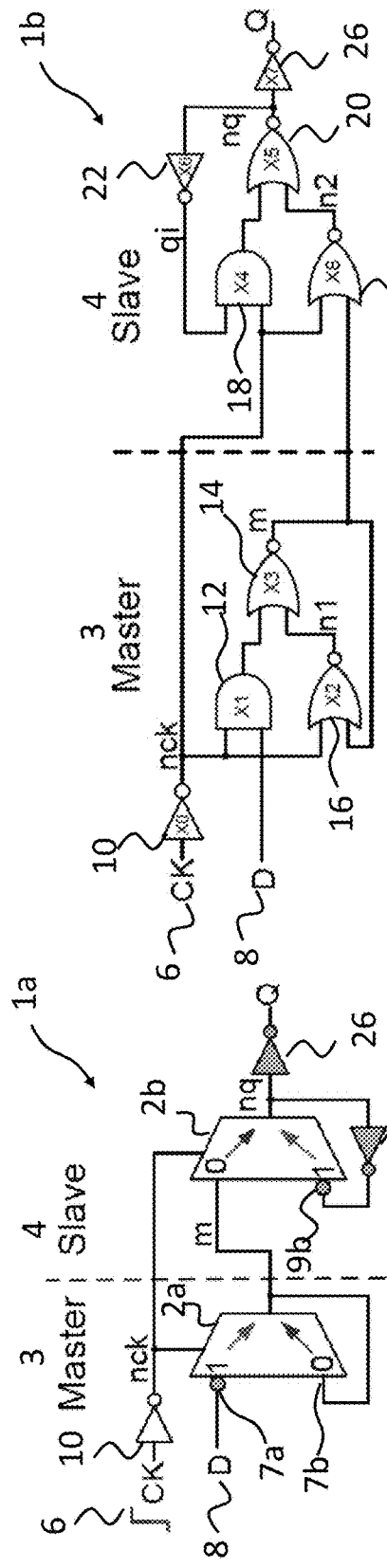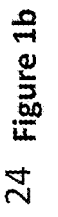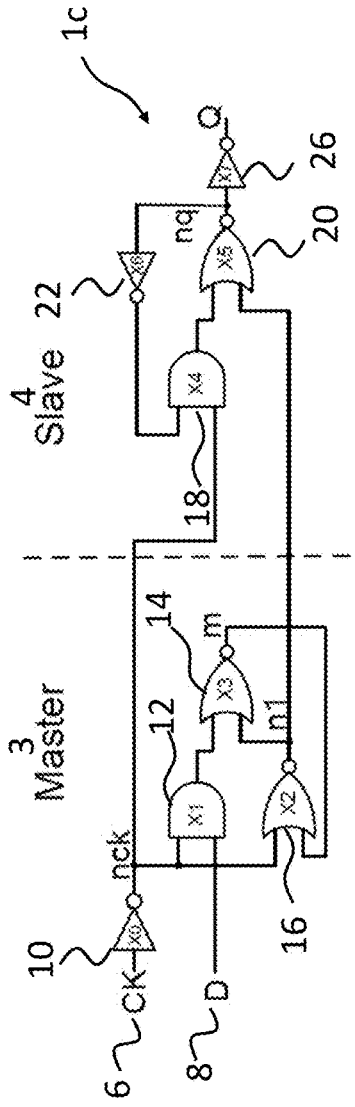

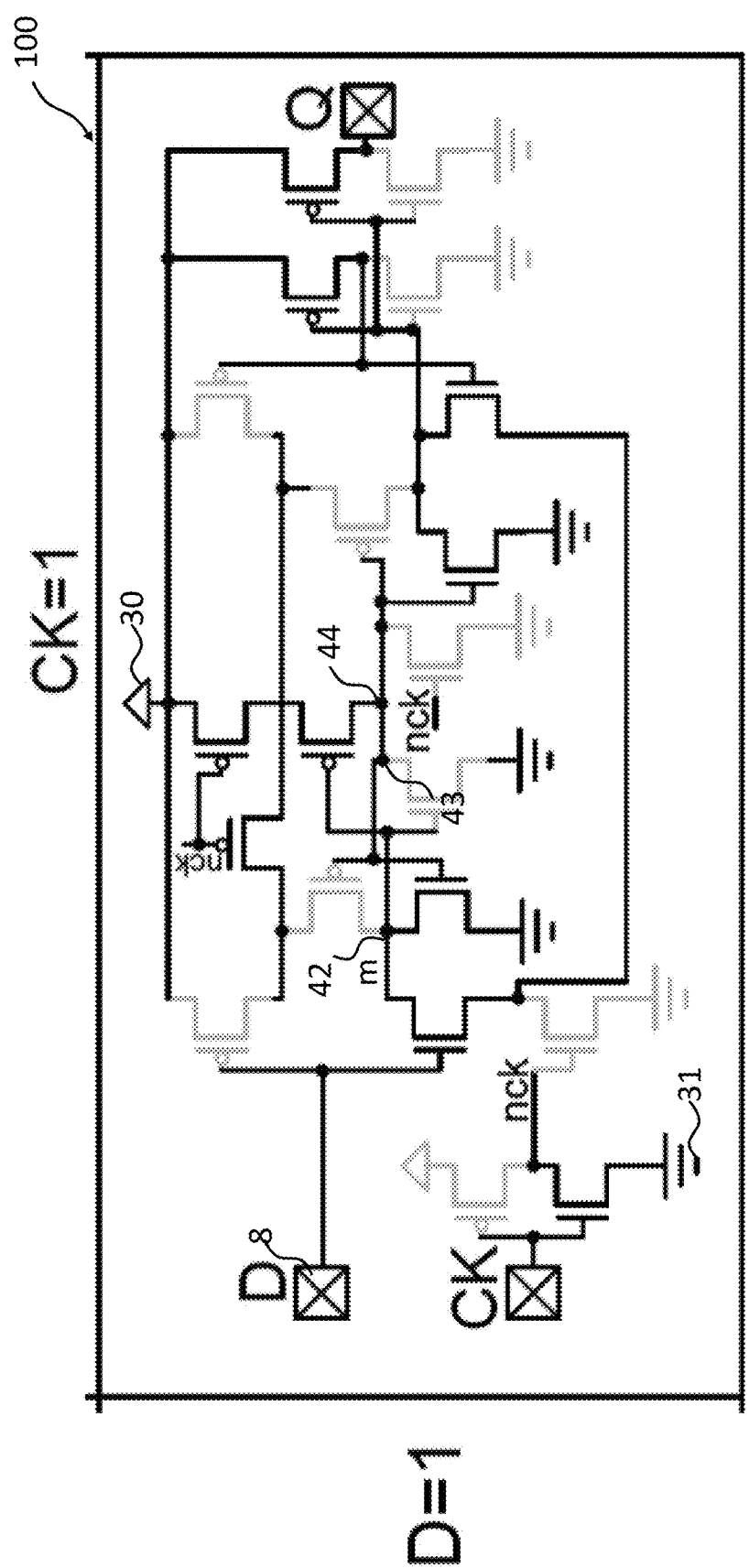

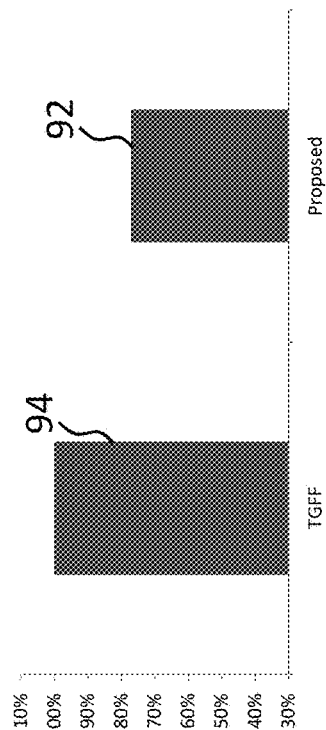
Figure 5b
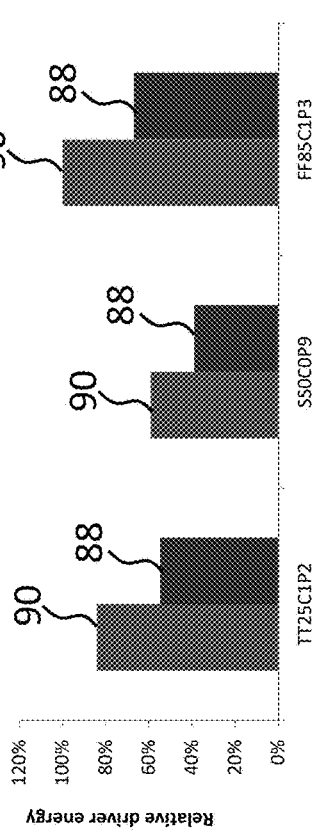
Figure 5d
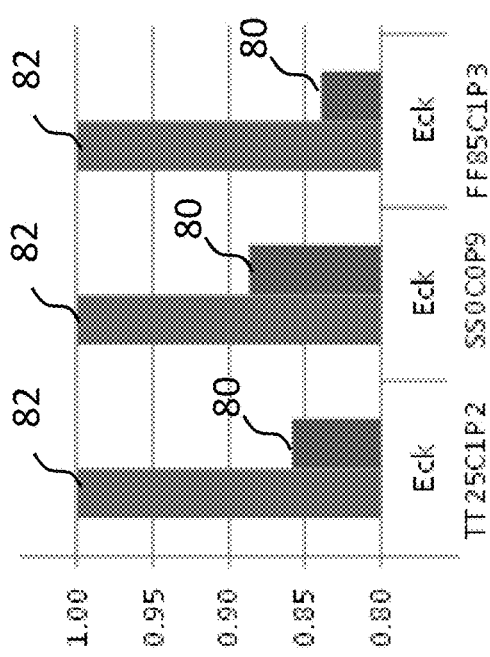
Figure 5a
Figure 5c

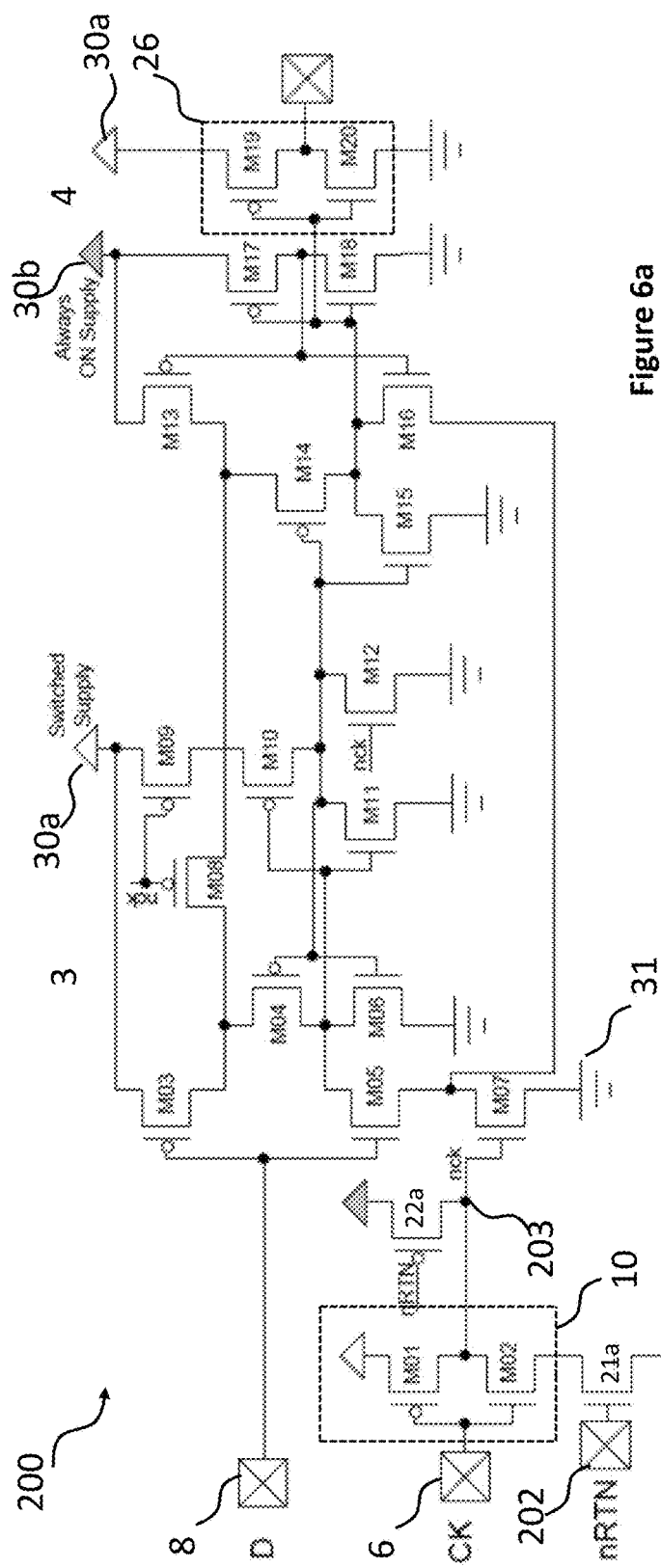

FLIP-FLOP

The present techniques generally relate to integrated circuits. More particularly, the present techniques relate to flip-flops.

Improvements to integrated circuits have resulted in powerful, compact and energy efficient computing devices, such as communication devices, tablets and smart-watches becoming available to consumers.

Such integrated circuits often include flip-flops for various operations, such as storage.

Techniques disclosed herein describe improvements to flip-flops.

According to a first technique, there is provided a single-phase flip-flop comprising: a master latch comprising: a first circuit to generate a master latch signal in response to a first master logic operation on a flip flop input signal and a first clock signal, and a second circuit to generate a master output signal in response to a second master logic operation on the first clock signal and master latch signal; a slave latch comprising: a third circuit to generate a slave output signal in response to a first slave logic operation on the first clock signal and one of the master output signal and an inverted slave output signal; and wherein the master latch is configured to capture the flip-flop input signal during a first portion of the first clock signal and the slave latch is configured to capture the master output signal during a second portion of the first clock signal.

According to a second technique, there is provided a digital system comprising a single phase flip-flop having a master latch comprising: a first circuit to generate a master latch signal in response to a first master logic operation on a flip flop input signal and a first clock signal, and a second circuit to generate a master output signal in response to a second master logic operation on the first clock signal and master latch signal; a slave latch comprising: a third circuit to generate a slave output signal in response to a first slave logic operation on the first clock signal and one of the master output signal and an inverted slave output signal; and wherein the master latch is configured to capture the flip-flop input signal during a first portion of the first clock signal and the slave latch is configured to capture the master output signal during a second portion of the first clock signal.

According to a third technique there is provided a single-phase flip-flop comprising twenty (20) switch elements arranged to provide static, contention free operation, wherein the flip-flop comprises a clock buffer.

According to a fourth technique there is provided a single-phase flip-flop comprising twenty-two (22) switch elements arranged to provide static, contention free and retention operation, wherein the flip-flop comprises a clock buffer.

According to a fourth technique there is provided a single-phase flip-flop comprising twenty-three (23) switch elements arranged to provide static, contention free and an asynchronous reset operation, wherein the flip-flop comprises a clock buffer.

According to a fifth technique there is provided a single-phase flip-flop comprising eighteen (18) switch elements arranged to provide static, contention free operation.

Further features of the present techniques will be apparent from the following detailed description which is to be read in conjunction with the accompanying figures.

FIG. 1a schematically illustrates an implementation of a flip-flop using multiplexers according to an embodiment;

FIG. 1b schematically illustrates an implementation of the flip-flop of FIG. 1a using circuits according to an embodiment;

FIG. 1c schematically illustrates a topologically compressed implementation of the flip-flop of FIG. 1b according to an embodiment;

FIG. 2a schematically illustrates an implementation of the flip-flop of FIG. 1c using switch elements;

FIG. 2b is a timing diagram for the flip-flop of FIG. 2a;

FIG. 3a schematically illustrates a topologically compressed implementation of the flip-flop of FIG. 2a according to an embodiment;

FIG. 3b is a timing diagram for the flip-flop of FIG. 3a;

FIGS. 4a to 4d schematically illustrate the operation of the flip-flop of FIG. 3a;

FIG. 5a illustrates simulated test results showing improvements in the operation of the flip-flop of FIG. 3a in comparison to the flip-flop of FIG. 2a;

FIGS. 5b to 5d illustrate simulated test results showing improvements in the operation of the flip-flop of FIG. 3a in comparison to a conventional standard cell flip-flop;

Figures 2A, 2B:
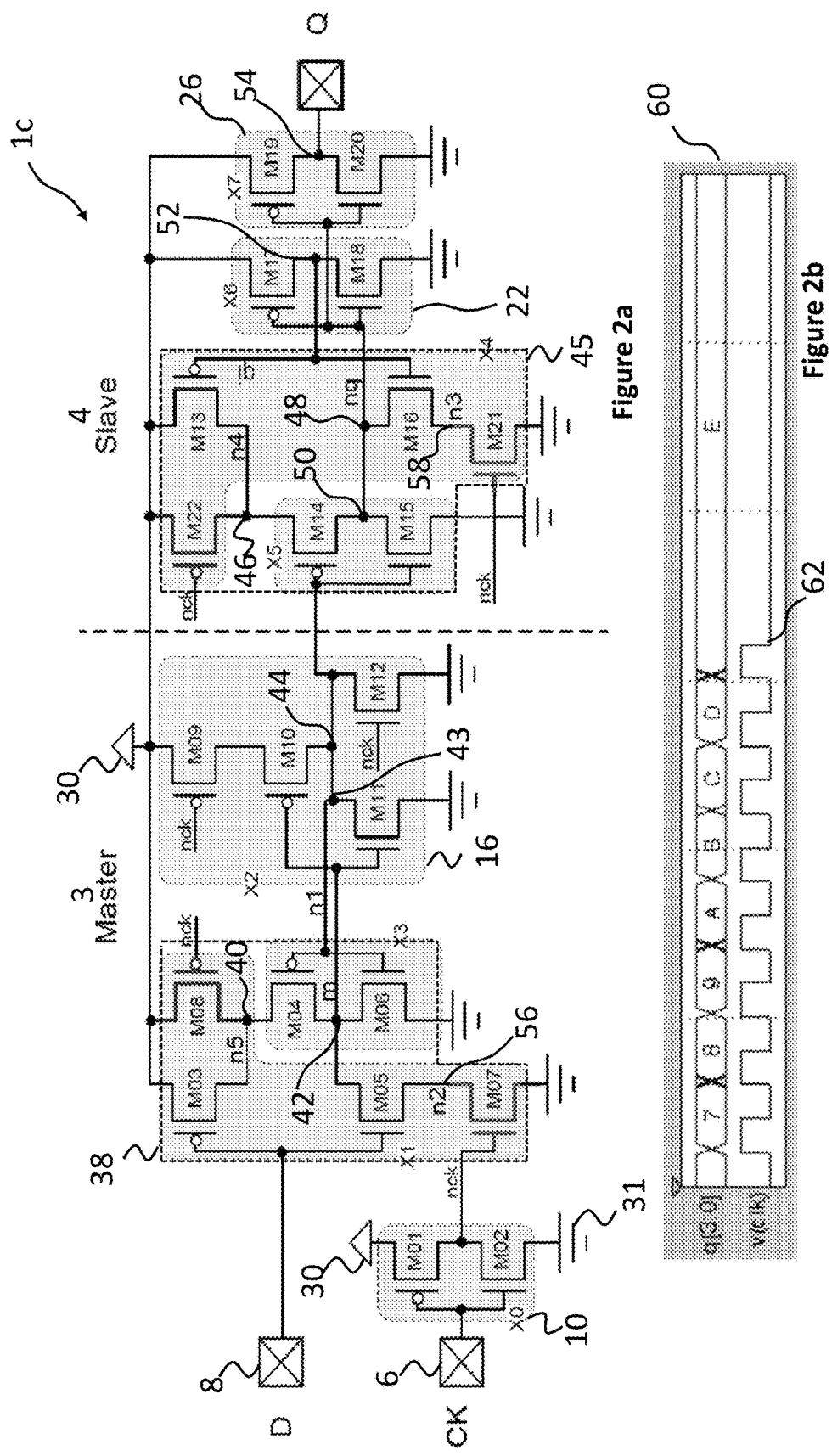
Figure 3A:
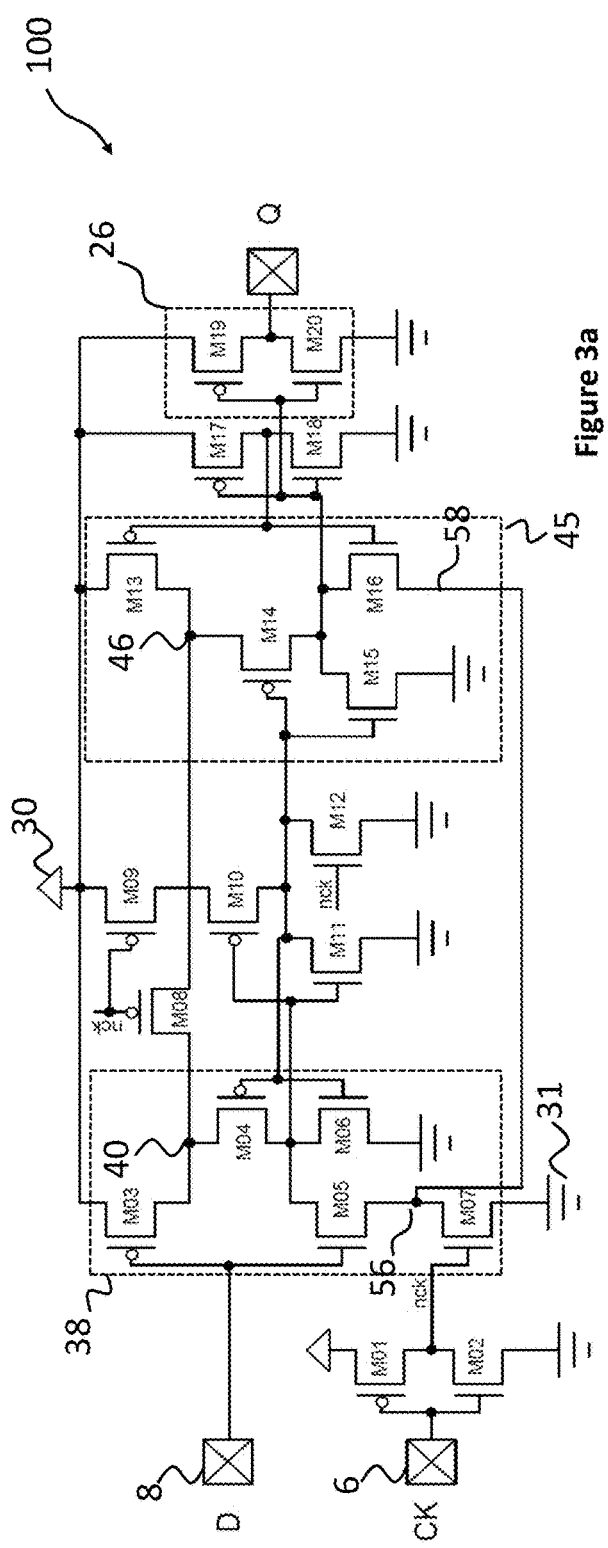
Figure 7A:
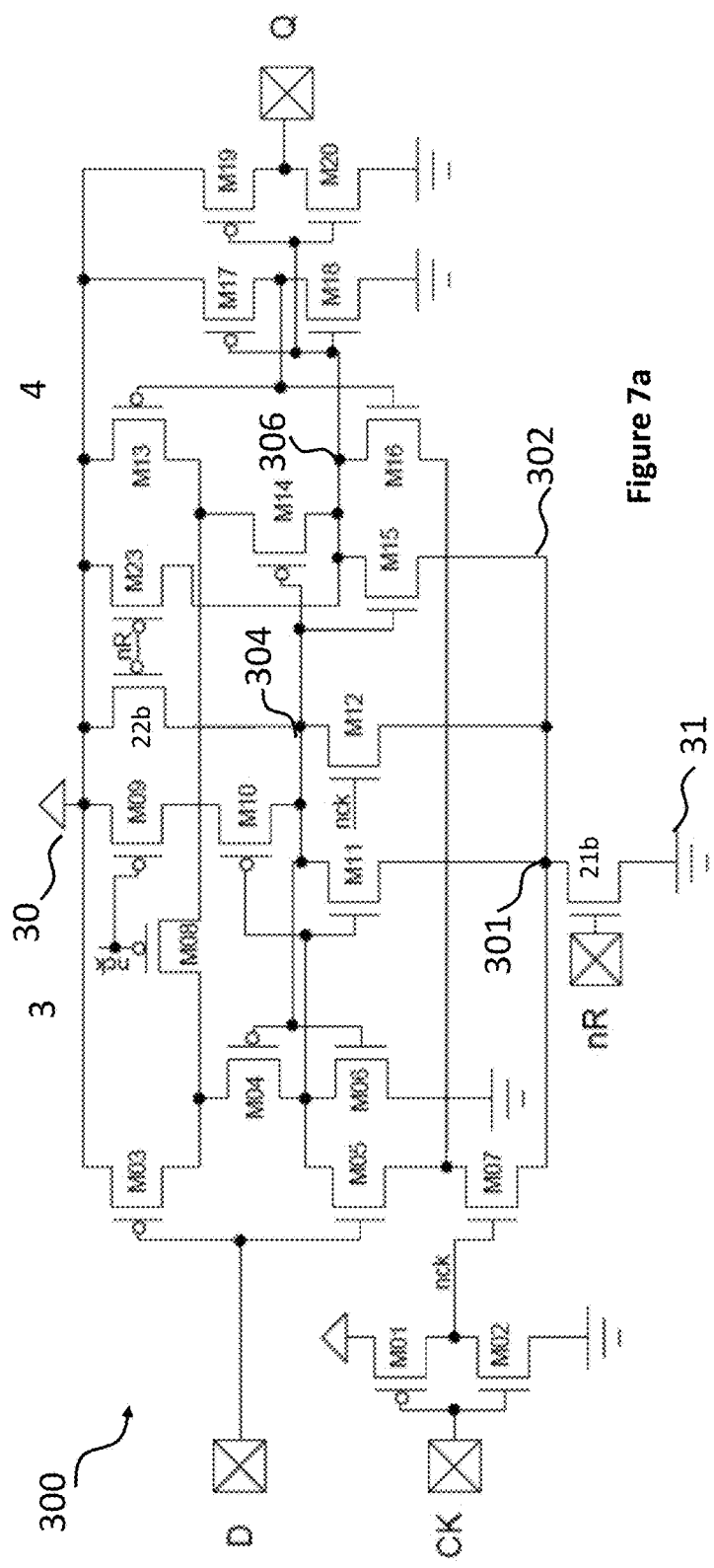
Figure 7B:
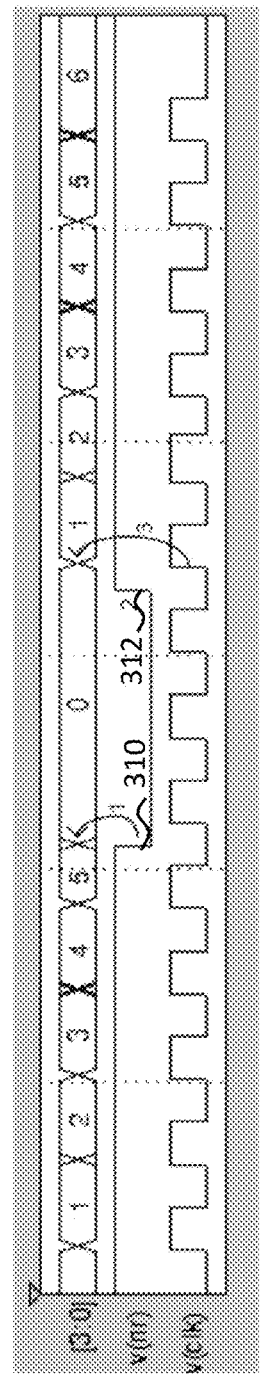
Figure 8A:
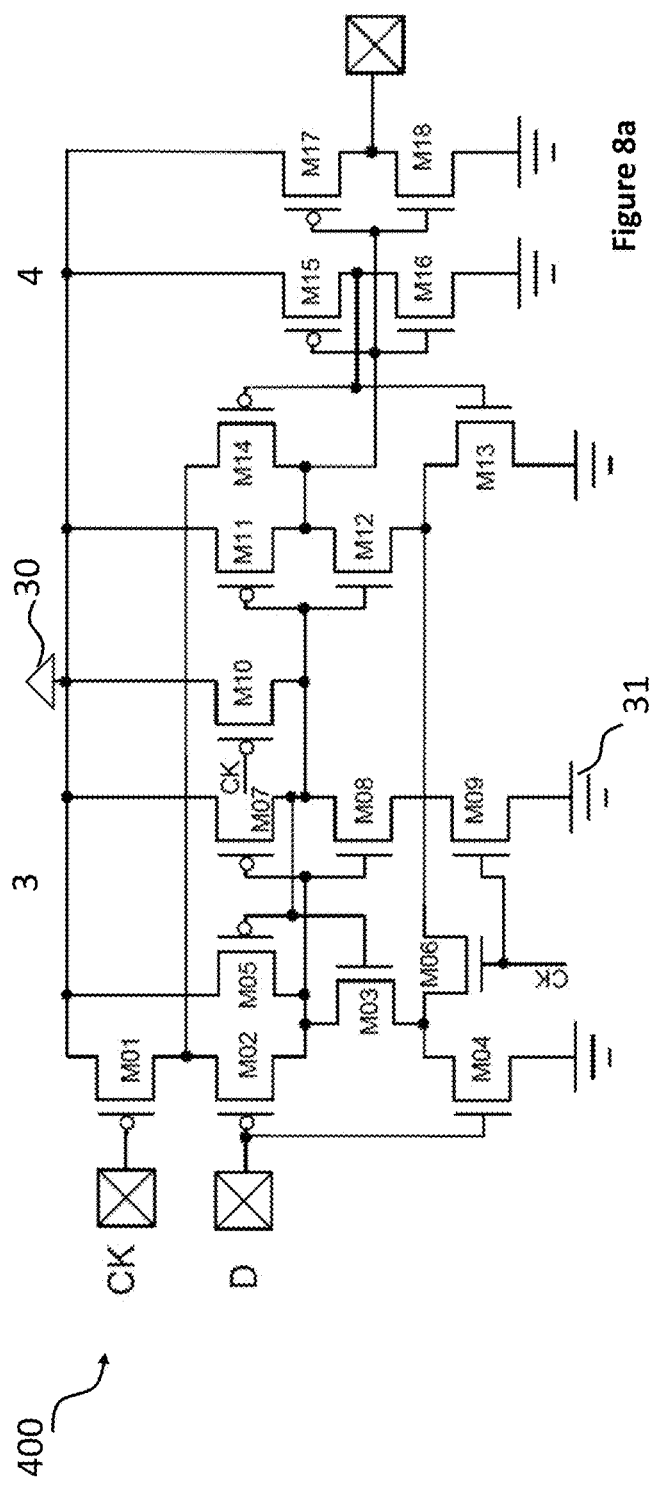
Figure 8B:
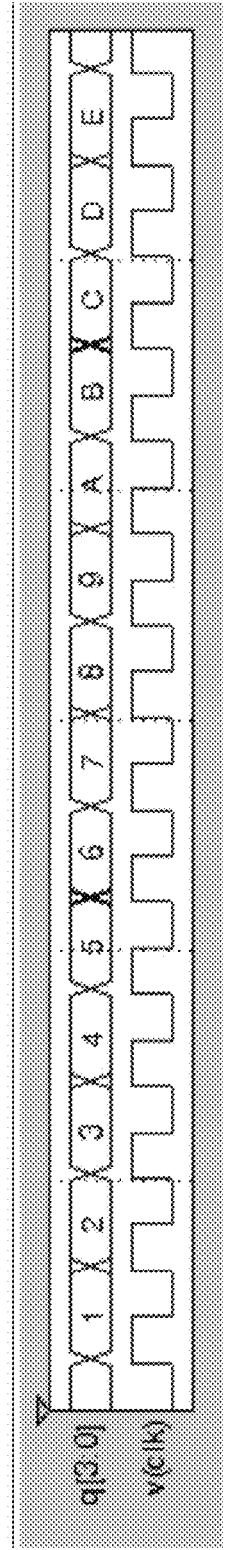

FIG. 6a schematically illustrates the flip-flop of FIG. 3a according to a further embodiment;

FIG. 6b is a timing diagram for the flip-flop of FIG. 6a;

FIG. 7a schematically illustrates the flip-flop of FIG. 3a according to a further embodiment;

FIG. 7b is a timing diagram for the flip-flop of FIG. 7a;

FIG. 8a schematically illustrates the flip-flop of FIG. 2a according to a further embodiment; and FIG. 8b is a timing diagram for the flip-flop of FIG. 8a.

Digital systems (e.g. central processing unit (CPU), graphics processing unit (GPU)) are, generally sequential and require sequential elements such as flip-flops.

As with many other components in digital systems, flip-flops consume power, whereby the majority of power consumed is clock power (power associated with clock toggling i.e. controlling a switch element in response to a clock signal) or data power (power associated with data toggling i.e. controlling a switch element in response to a data signal (hereafter data (D))). However, data toggling is generally reduced in comparison to clock toggling because transistors receive the clock signal switch every clock cycle irrespective of whether data changes every cycle, and therefore clock power consumption is greater than data power consumption.

However, it's not only flip-flops which consume power in digital systems. For example, the clock network of the digital system, hereafter referred to as "clock tree", which provides the clock signal to each flip-flop to toggle the switch elements also consumes power, and the power increases as the number of switch elements (e.g. transistors), and associated gate capacitances, of the flip-flops increase.

FIG. 1a schematically illustrates an implementation of a flip-flop 1a using multiplexers (MUX) 2a/2b, which in the present illustrative example is a CMOS implementation.

FIG. 1b schematically illustrates flip-flop 1b as an implementation, which in the present illustrative example is a logic level implementation of flip-flop 1a in FIG. 1a, whereby the flip-flops 1a & 1b comprise a master latch 3 and a slave latch 4 comprising a plurality of circuits each having one or more logic gates. Like numbering will be used to describe like features throughout.

FIG. 1c schematically illustrates flip-flop 1c as a topologically compressed implementation of flip-flop 1b of FIG. 1b, whereby flip-flop 1c comprises a reduced number of circuits in comparison to flip-flop 1b, whilst providing substantially identical functionality.

In the present illustrative examples, the flip-flops 1a-c also comprise a clock input 6 to receive clock signal (ck) and data input 8 to receive data (D), whereby the clock signal (ck) transitions every cycle, for example, for a first portion of the clock signal (ck) when it transitions low (from logic level '1' to logic level '0' (falling edge)) and for a second potion of the clock signal (ck) when it transitions high (from logic level '0' to logic level '1' (rising edge)), at a frequency as required by a particular application. In the present illustrative examples, the flip-flops 1a-1c are single-phase edge-triggered flip-flops.

In operation, and looking at FIG. 1a, a local clock buffer, shown as first inverter 10, inverts the clock signal (ck) to generate, or provide, an inverted clock signal (nck) such that, for a first portion of the clock signal (ck) (e.g. when clock signal (ck) transitions low), inverted clock signal (nck) transitions high, and the data (D) data enters MUX 2a in the master latch 3, whereby the MUX 2a is considered open so data (D), inverted at the input 7a, passes through to output of MUX 2a to provide master latch signal (m).

Conversely, for a second portion of the clock signal (e.g. when clock signal (ck) transitions high) the inverted clock signal (nck) transitions low, and, therefore, the MUX 2a is closed such that data (D) cannot pass therethrough and the data which passed therethrough when clock signal (ck) transitioned low is captured in the master latch 3, and is returned to the MUX 2a at input 7b via feedback path.

For the MUX 2b in the slave latch 4, the operation is reversed, when clock signal (ck) transitions high, inverted clock signal (nck) transitions low, and the MUX 2b is considered open so master latch signal (m) enters MUX 2b to provide slave latch signal (nq) which is inverted by inverter 26 to provide flip-flop output (Q).

Conversely, when clock signal is (ck) transitions low the inverted clock signal (nck) is high, and the MUX 2b is closed such that the master latch signal (m) cannot pass therethrough. Therefore, the master latch signal (m) which passed therethrough when clock signal (ck) transitioned low is captured in the slave latch as signal (nq) and used as a feedback to input 9b of MUX 2b, whereby slave latch signal (nq) is inverted with inverter 22 on the feedback path and the complement of the inverted signal ($\approx$(nq)) is entered at input 9b.

Turning to the implementation of FIG. 1b, master latch 3 of flip-flop 1b comprises a circuit comprising first AND logic gate 12 and first NOR logic gate 14 to generate master latch signal (m), wherein the first AND logic gate 14 is responsive to inverted clock signal (nck) from clock buffer 10, and data (D) from data input 8, whilst an output from first AND logic gate 12 is provided as a first input to NOR logic gate 14.

Master latch 3 also comprises further circuit comprising second NOR logic gate 16 which is responsive to inverted clock signal (nck) and master latch signal (m) to generate output (n1), whereby output (n1) is used as a second input to the first NOR logic gate 14.

The slave latch 4 of flip-flop 1b comprises a circuit comprising second AND logic gate 18 and third NOR logic gate 20, whereby the second AND logic gate 18 receives inverted clock signal (nck) as a first input, whilst an output from second AND logic gate 18 is used as a first input to third NOR logic gate 20 which generates the slave latch signal (nq). The slave latch signal (nq) is inverted using further circuit comprising second inverter 22, and the output (qi) of second inverter 22 is provided as a second input to second AND logic gate 18.

Slave latch 4 of flip-flop 1b includes a circuit comprising fourth NOR logic gate 24 which is responsive to inverted clock signal (nck) and master latch signal (m) as first and second inputs respectively and generates signal (n2), whereby signal (n2) is used as a second input to the third NOR logic gate 20. The slave latch signal (nq) is also inverted by a further circuit comprising output inverter 26 to provide flip-flop output (Q).

It will be seen that the second and fourth NOR logic gates 16 and 24 provide substantially identical functionality (NOR logic operations) and receive substantially identical inputs (i.e. inverted clock signal (nck) & master latch signal (m)), and, therefore, the respective outputs are also substantially identical (i.e. (n1)$\approx$(n2)).

It will be seen, therefore, that, the circuit comprising second NOR logic gate 16 and the circuit comprising fourth NOR logic gate 24 have substantially logically equivalent operation and may be merged or consolidated, as illustrated by the flip-flop 1c schematically shown in FIG. 1c.

In consolidating the circuits of FIG. 1b, the functionality of flip-flop 1c is similar to that of flip-flop 1b, but with a reduced number of circuits and/or logic gates.

Furthermore, in flip-flop 1c, the second NOR logic gate 16 receives inverted clock signal (nck) & master latch signal (m) as inputs, whilst the output (n1) is the master latch output provided as an input to the third NOR logic gate 20 in the slave latch 4.

Such a consolidated configuration provides an improvement in the power efficiency and spatial efficiency of the flip-flop 1c in comparison to flip-flop 1b due to, for example, a reduction in the number of circuits or logic gates (e.g. from 9 logic gates to 8 logic gates in the present illustrative example).

FIG. 2a schematically illustrates flip-flop 1c as a switch element implementation of the logic gate level implementation of FIG. 1c.

For the implementations which follow, the switch elements comprise transistors, for example, metal-oxide-semiconductor field effect transistors (MOSFETS), such as NMOS and PMOS transistors, to permit or prevent current to pass between source and drain terminals and the current flow controlled based on, or in response to, a signal (e.g. voltage) applied to a gate terminal. Such signals may be a clock signal or data (D).

It will be appreciated that in the following examples, when a transistor is "on" or "closed", current can pass between the source and drain, whilst when a transistor is "off" or "open", current is prevented from flowing between the source and drain.

It will also be understood that other types of transistors (for example, field effect transistors (FETs), bipolar junction transistors (BJT) etc.) or other types of devices/components may be used as a switch element, and that claimed subject matter is not limited in this respect.

As above, master latch 3 comprises a clock buffer implemented as an inverter 10 to provide inverted clock signal (nck), whereby, in the present illustrative example, the inverter 10 is implemented as a PMOS transistor (M01) arranged in series with an NMOS transistor (M02) between a first voltage source 30 (e.g. VDD) and a second voltage 31 (e.g. ground). In the present illustrative example, the first voltage source may be a power supply (not shown) which may be controlled by a power management unit.

Providing the local clock buffer internally within the flip-flop 1c reduces the capacitance as seen from the clock driver on the clock line (not shown) and also provides a deterministic clock slew rate, to provide for more reliable operation. Furthermore, without local clock buffering, the gate capacitance on the clock line may increase as the number of flip-flops sharing the clock line increases, which may be undesirable.

As will be appreciated, the following description of the transistor level implementation does not describe a 1:1 mapping of transistor configurations to the individual AND and/or NOR logic gates of FIG. 1c because the functionality of the individual logic gates of FIG. 1c may be provided by configuring the transistors as compound logic gates such as AND-OR invert (AOI) logic gates to provide AND-NOR operation and/or OR-AND Invert (OAI) logic gates to provide OR-NAND operation, whereby such compound gates can readily be implemented using transistor configurations, and whereby the total number of transistors is less than if the logic gates were implemented individually.

As an illustrative example, the first AND logic gate and first NOR logic gates of FIG. 1c are implemented by AOI logic gate 38 whereby PMOS transistors (M03 & M08) are arranged in parallel between first voltage source and node 40, and NMOS transistors (M05 & M07) are arranged in series between the second voltage 31 and node 42.

The respective gates of NMOS transistor (M07) and PMOS transistor (M08) are controlled responsive to inverted clock signal (nck), whilst the gates of both PMOS transistor (M03) and NMOS transistor (M05) are controlled responsive to data (D) from data input 8.

Furthermore, a PMOS transistor (M04) is arranged in series with NMOS transistor (M06), between node 40 and the second voltage 31, whereby master latch signal (m) is at the node 42 between transistors (M04 & M06).

The second NOR logic gate 16 of master latch 3 is implemented using PMOS transistors (M09 & M10) arranged in series between first voltage source 30 and node 44, and NMOS transistors (M11 & M12) arranged in parallel between node 44 and second voltage 31.

The gates of PMOS transistor (M10) and NMOS transistor (M11) are controlled responsive to master latch signal (m), whilst the gates of PMOS transistor (M09) and NMOS transistor (M12) are controlled responsive to the inverted clock signal (nck) to generate master latch output (n1), whereby the respective gates of transistors (M04 and M06) of compound logic gate 38 are controlled responsive to master latch output (n1).

The second AND logic gate and third NOR logic gates of FIG. 1c are also implemented using AOI logic gate 45 whereby PMOS transistors (M13 & M22) are arranged in parallel between first voltage 30 and node 46, and NMOS transistors (M16 & M21) are arranged in series between the second voltage 31 and node 48.

The respective gates of NMOS transistor (M21) and PMOS transistor (M22) are controlled responsive to inverted clock signal (nck).

Furthermore, a PMOS transistor (M14) is arranged in series with NMOS transistor (M15) between node 46 and the second voltage 31, whereby the gates of transistors (M14 & M15) are controlled responsive to master latch output (n1), and whereby the slave latch signal (nq) is at node 50 between transistors (M14 & M15).

Second inverter 22, of slave latch 4, is implemented by PMOS transistor (M17) arranged in series with NMOS transistor (M18) between first voltage source 30 and second voltage 31 with inverter output (qi) at node 52, and whereby the whilst the gates of both PMOS transistor (M13) and NMOS transistor (M16) are controlled responsive to inverter output (qi).

Similarly, output inverter 26, is implemented by PMOS transistor (M19) arranged in series with NMOS transistor (M20) between first voltage source 30 and second voltage 31.

In the present example, the gates of transistors (M17-M20) are each electrically coupled to node 50 and controlled responsive to slave latch signal (nq).

The output from node 54 is provided as the output of flip-flop 1c (Q).

The transistor level implementation comprises floating nodes in response to certain clock values. For example, either node 56 floats or node 58 floats dependent on the value of master latch output (n1), whereby value n2 is at node 56 and value n3 is at node 58.

However, the values of the floating nodes that arise during the operation of flip-flop 1c do not affect the storage state thereof or the output Q, and, therefore, the configuration of flip-flop 1c provides for static operation.

Generally, flip-flops using a single-phase clock have dynamic operation whereby the output (Q) changes when the clock signal is removed (e.g. clock gating). The rate of such a change will be dependent on, for example, the rate of discharge of voltage/current within the flip-flop.

However, the timing diagram 60 of FIG. 2b demonstrates the static operation of single-phase flip-flop 1c, whereby when the clock signal v(ck) is removed 62, the output q[3:0] does not change.

Furthermore, some flip-flops may suffer from contention whereby two or more values or drivers drive the same line/component. In such configurations, additional transistors may be provided to reduce the effects of contention, which may increase the size, capacitance (e.g. gate capacitance) and power consumption of the flip-flop.

It will be appreciated that flip-flop 1c, which comprises 22 transistors (22T), does not suffer contention, and, therefore, provides a fully-static, contention free operation with local clock buffering. Furthermore, whilst the clocked transistors M07, M08, M09, M12, M21 and M22 are all clocked with the same inverted clock signal, the flip-flop is a single-phase flip-flop.

As described above, reducing the number of transistors in the flip-flop may, in turn, reduce the size, power consumption and capacitance of flip-flop 1c.

In some embodiments, the transistor level implementation of the flip-flop 1c may be compressed through topological compression by merging the transistors having logically equivalent functionality whilst maintaining the functionality of the circuit.

Looking at flip-flop 1c of FIG. 2a in more detail:
When nck=0 (for a first portion of the clock signal (ck)), then qi=n1, and
When nck transitions to logic 1 (for a second portion of the clock signal (ck)), then qi=n1 is latched and the following holds:
For transistors (M7 and M21):
For nck=1 (for a first portion of the clock signal (ck) when clock signal transitions from 1 to 0), the respective values n2 & n3≈0.
For nck=0 (for a second portion of the clock signal (ck) when clock signal transitions from 1 to 0), the value n2 at node 56 floats or the value n3 at node 58 floats dependent on the value master latch output (n1), and these values never contend.
When n1=1, transistor (M4) is turned off and the value n2 floats.
When n1=0, transistor (M16) is off and the value n3 floats.

Therefore, it will be seen that the functionality of transistors (M07 & M21) is logically equivalent and the transistors can be merged whilst the functionality of the flip-flop is maintained.

Similarly: For Transistors (M08 & M22):
For nck=1;
nodes 40 and 46 are isolated and depend on both data (D) and inverter output (qi) respectively.
For nck=0, master latch 3 is closed and master latch output (n1) is isolated from the data input 8.
Both transistors (M13 & M14) are controlled by the same state (i.e. n1=qi) independent of data (D).
When master latch output (n1) is high, then transistors (M13 & M14) are off and the state of transistor (M3), controlled responsive to data (D), is irrelevant to the functionality of the flip-flop.
When master latch output (n1)=0, the value at node n4 is driven high by transistor (M13) and it is irrelevant whether D=1 or D=0.

Therefore, it will be seen that the functionality of transistors (M08 & M22) is logically equivalent for the first and second portions of the clock signal (ck) and the transistors can be merged whilst the functionality of the flip-flop is maintained.

FIG. 3a schematically illustrates a topologically compressed implementation of the flip-flop 1c of FIG. 2a having merged transistors (M07 & M21) and also merged transistors (M08 & M22), whereby flip-flop 100 of FIG. 3a provides substantially identical functionality as the flip-flop of FIG. 2a with a reduced number of transistors (T20) which provides for reduced chip-size, and also provides a reduced number of transistors being toggled by the inverted clock signal (nck), which provides for a reduction in capacitance and power consumption.

In the present illustrative example, having merged transistors (M08 & M22), PMOS transistor (M08) is coupled between nodes 40 and 46, and the gate of transistor (M08) is controlled responsive to the inverted clock signal (nck). As such it will be seen that transistor (M08) is shared by the A01 logic gates 38 & 45.

Furthermore, after merging transistors (M07 & M21) transistor (M16) is provided in electrical communication with node 56.

As with flip-flop 1c of FIG. 2a described above, flip-flop 100 provides for single-phase, fully-static, contention free operation with local clock buffering but with 20 transistors (20T) in comparison to 22T for flip-flop 1c. The reduction in the number of transistors provides for a reduction in size, power consumption and/or capacitance of the 20T flip-flop 100 in comparison to the 22T flip-flop.

Figure 3B:
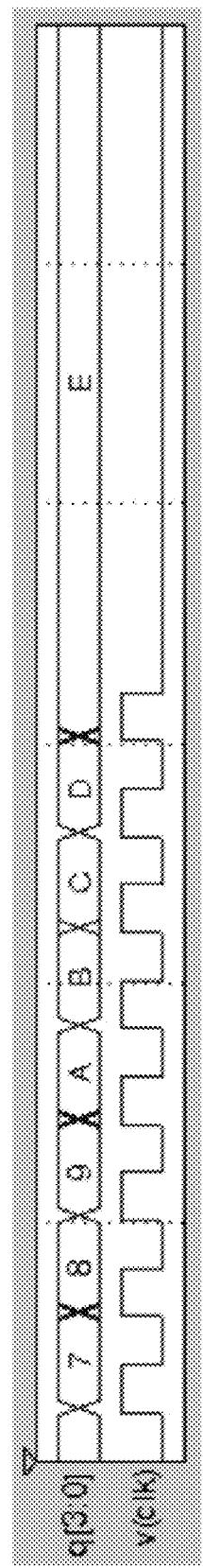

As above with the timing diagram of FIG. 2b, the timing diagram of FIG. 3b demonstrates the static operation of flip-flop 100, whereby when the clock signal v(clk) is removed (e.g. clock gating) the output q[3:0] does not change.

As previously described, the flip-flops of the present illustrative examples are single-phase edge triggered flip-flops and so, in operation, the master latch 3 is opened and transparent to receive data D when the clock signal transitions low, whilst the slave latch 4 will hold state and retain the value (R) (i.e. high or low)) received at the previous clock portion (e.g. a transition from low to high during the previous clock period).

Figure 4A:
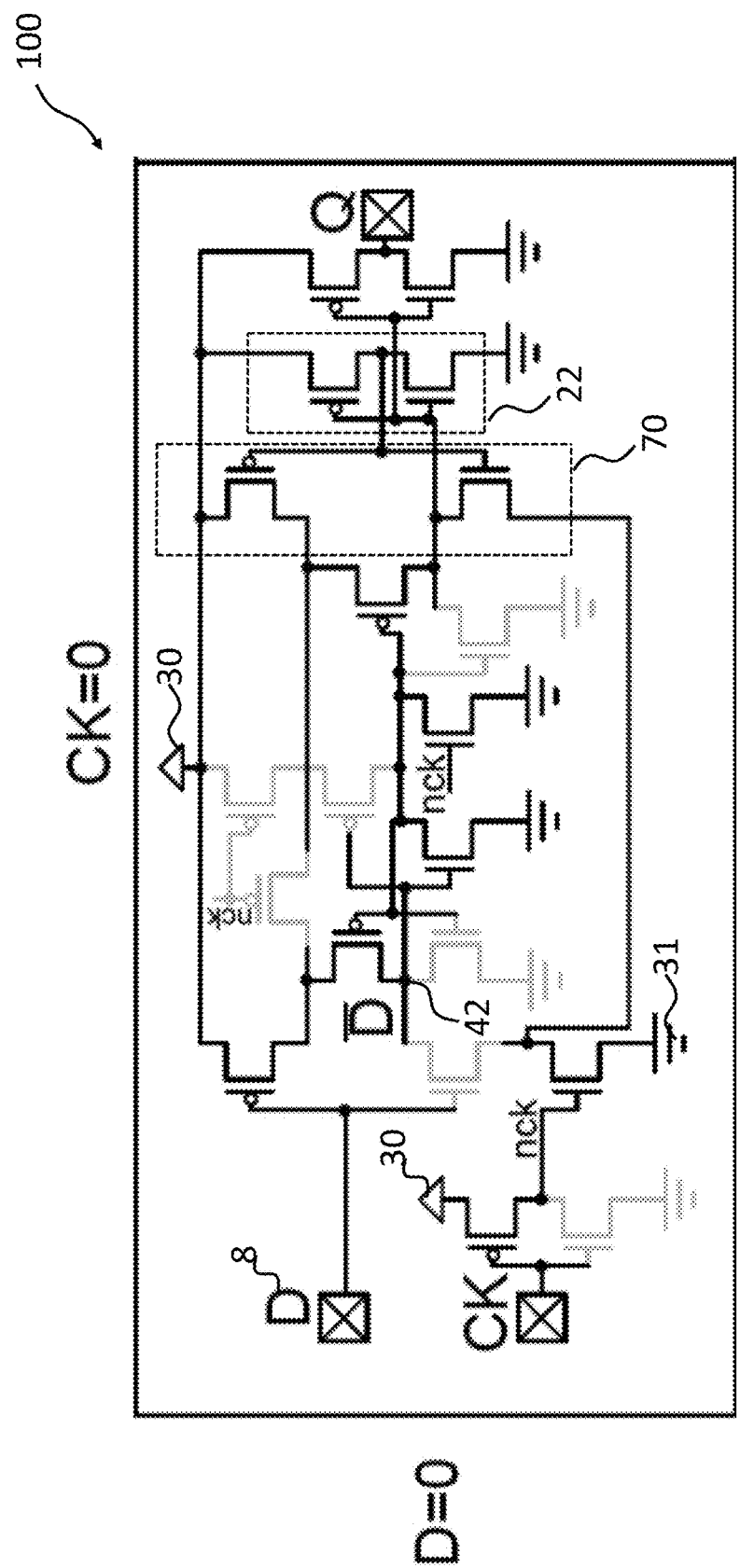

An overview of the operation of flip-flop 100 is demonstrated in FIGS. 4a-4d, with references to transistor numbering made to FIG. 3a, and whereby one skilled in the art will understand the operation having taken account of the present description:

For FIG. 4a: data (D)=0 and clock signal (ck)=0 (having transitioned from 1 in a portion of the clock signal (ck)).

When clock signal (ck)=0, transistor (M01) is on whilst transistor (M02) is off, and therefore inverted clock signal (nck)=1=first voltage source 30.

The inverted clock signal (nck) being high, turns on transistors (M07 & M12), whereby transistor (M12) being on pulls down the master latch output (n1) at node 44 to the second voltage 31 (low), such that transistor (M14) turns on, effectively creating a short between transistors (M13 & M16).

With transistors (M07 & M14) are turned on, transistors (M13 & M16) are operable as a first inverter 70, and transistors (M17 & M18) are operable as a second inverter 22. It will be appreciated that the back-to-back inverters 70 and 22 operate as a latch, which holds a current value (1 or 0) at node 52 until transition of the clock signal (ck) to 1 in a subsequent clock period.

As mentioned above, the master latch 3 is open to receive data (D) when ck=0, because when data (D)=0, transistor (M03) is on whilst transistor (M12) being on and pulling down the master latch output (n1) means PMOS transistor (M04) is also on, whereby the master latch signal (m) is at node 42, pulled up to the first voltage 30 via transistors (M03 & M04). It will be seen that the master latch signal (m) is the complement of the data (D) at data input 8.

The master latch signal (m) being high turns on transistor (M11), such that node 43 is pulled low, which does not affect the operation of the slave latch 4.

Figure 4B:
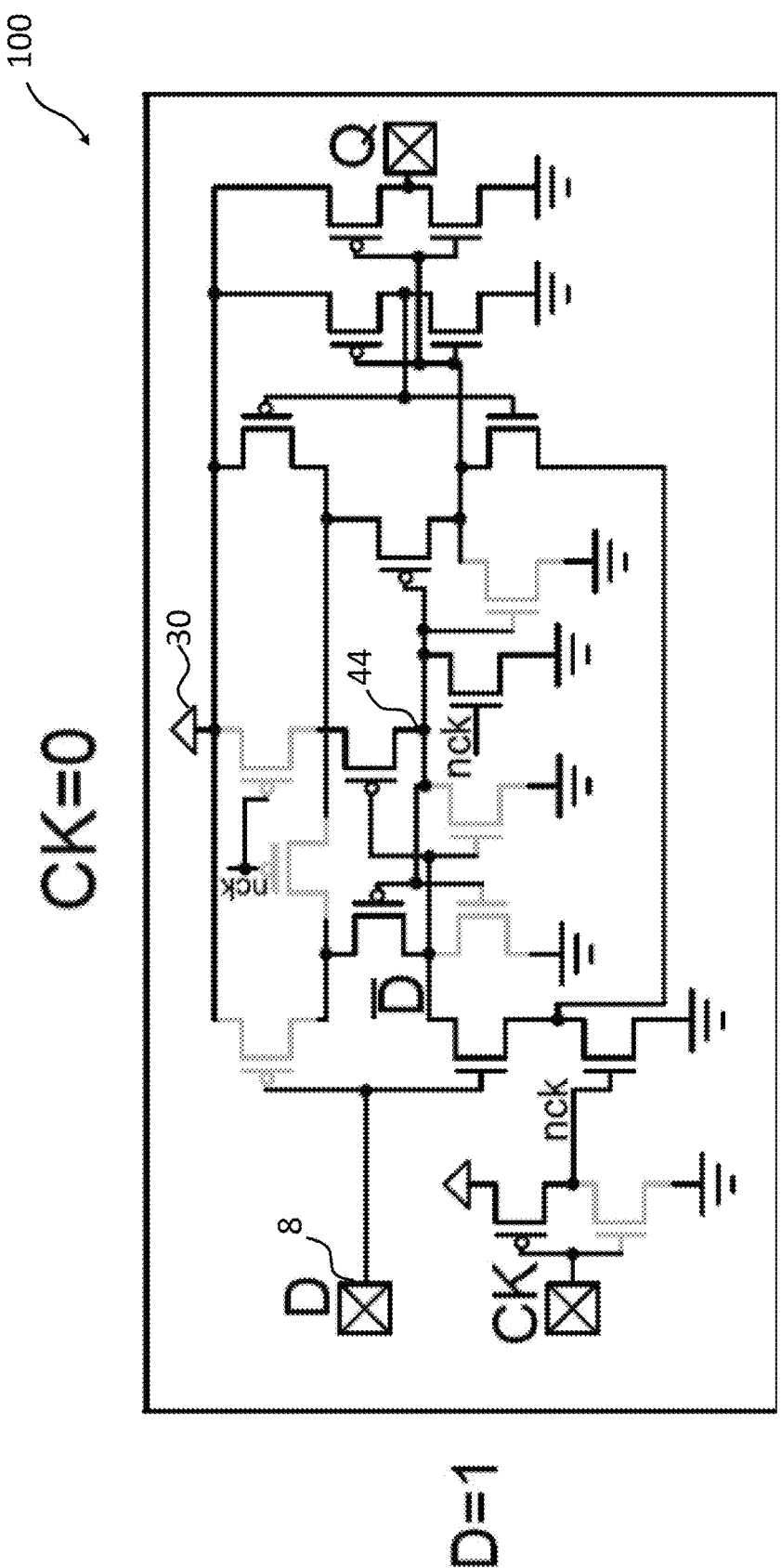

For FIG. 4b, data (D)=1 and clock signal (ck)=0 (having transitioned from 1 in a portion of the clock signal (ck)).

As described above in FIG. 4a, clock signal (ck)=0 results in inverted clock signal (nck) being high which turns on transistors (M07 & M12), and provides that back-to-back inverters 70 and 22 operate as a latch such that the slave latch 4 performs the same operation as described from FIG. 4a, and holds a current value (1 or 0) until transition of the clock signal (ck) to 1 in a subsequent clock period.

When data (D) transitions from 0 to 1, transistor (M05) turns on, and with transistor (M07) also turned on, node 42 is pulled down to the second voltage (i.e. low). Although PMOS transistor (M10) is turned on in response to the master switch signal (m) being low, PMOS transistor (M09) is off (due to inverted clock signal (nck) being high), such that node 44 does not have a path to the first voltage source, and, therefore, the slave latch 4 is not affected by the change in the data (D). It will be seen that there is no other transistor or component attempting to drive node 42 high, so the configuration is contention free.

It will be seen therefore that, when (ck)=0 (having transitioned from 1), any changes on the data input (D) will be transferred to the internal node 42 in the master latch 3 and held there without affecting the slave latch 4.

So any changes on the data input when clock signal=0 will be transferred to internal node 42 and retained there.

Figure 4C:
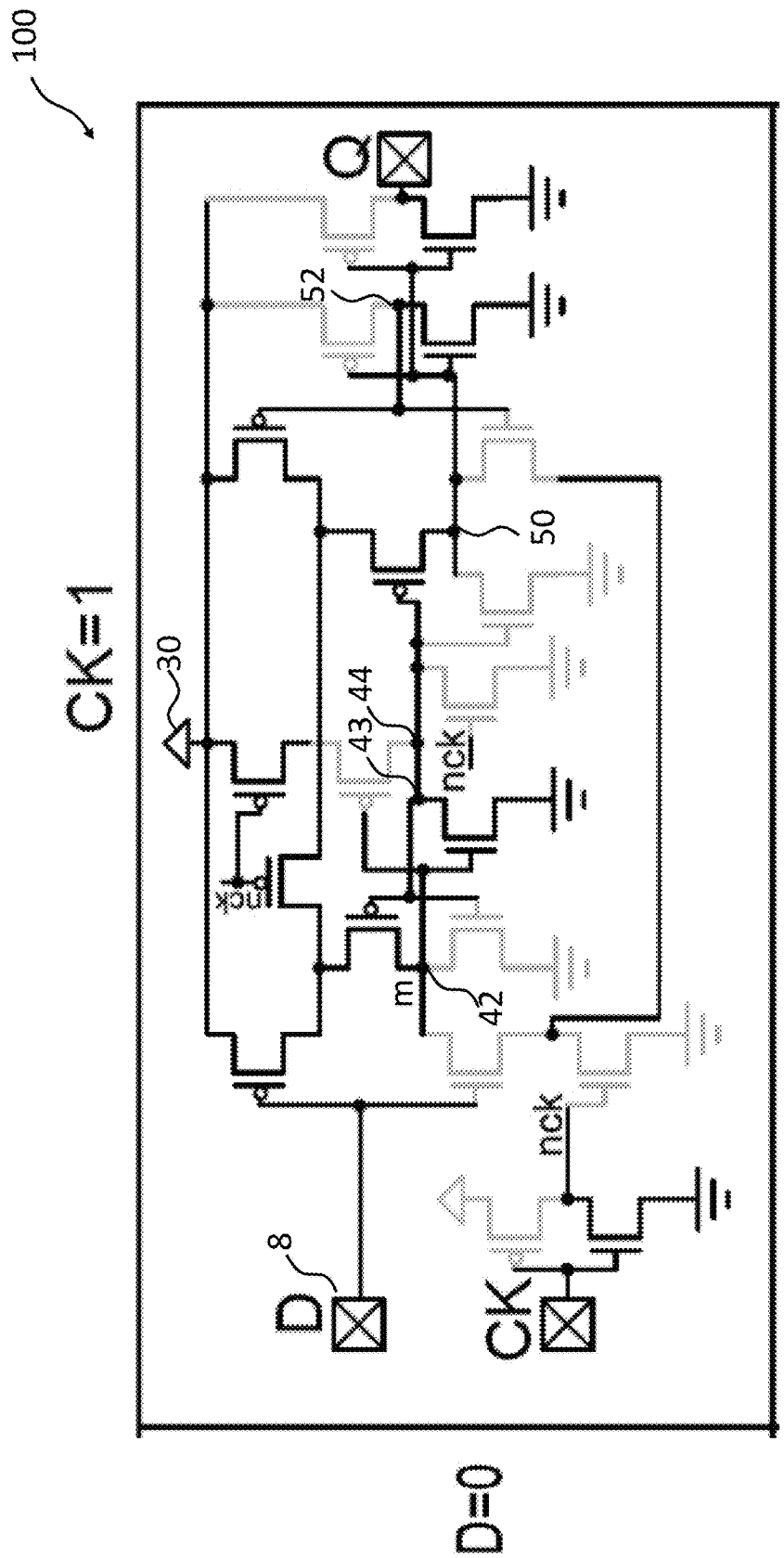

In FIGS. 4c and 4d, the clock signal transitions high such that clock signal (ck)=1 (having transitioned from 0 in a previous portion of the clock signal (ck)), whereby, the slave latch 4 is opened to receive data from the master latch 3, whilst the master latch 3 holds state.

For FIG. 4c, data (D)=0 and clock signal (ck)=1.

FIG. 4c demonstrates that the slave latch 4 retains a value (R) at node 52 from a previous portion of the clock signal (ck), e.g. as described above in FIGS. 4a and 4b.

When the value (R)=0, PMOS transistor (M13) is turned on.

From above, data (D)=0, means the master latch signal (m)=1 (i.e. complement of data (D)), so NMOS transistor (M11) is on which pulls node 43 down to the second voltage (i.e. low).

With node 43 being low, PMOS transistor (M14) turns on, which pulls node 50 high through transistors (M13 & M14). With node 50 pulled high, transistor (M18) turns on, such that node 52 is pulled low, and therefore, R=0, which demonstrates that slave latch stored a 0 in the previous portion of the clock signal (ck).

For FIG. 4d, data (D)=1 and clock signal (ck)=1.

FIG. 4d demonstrates that if the value of data D changes from 0 to 1 after the clock transition from 0 to 1, the master latch output (n1) will be unaffected by the change in data (D) because the value at node 43 will not change.

It will be appreciated, therefore, that FIGS. 4a-4d demonstrate the operation of flip-flop 100 for different portions of the clock signal (ck) and changing values of D.

FIG. 5a illustrates simulated test results showing improvements obtained by the 20T flip-flop 100 in comparison to the 22T flip-flop of FIG. 2a.

As shown in the simulated test results, the clock energy (Eck) of the 20T flip-flop (shown by bars 80) is reduced in comparison the clock energy of the 22T flip-flop (shown by bars 82).

Furthermore, the reduced transistor count for the 20T flip-flop provides for a reduced capacitance and corresponding chip size in comparison to the 22T flip-flop.

FIGS. 5b to 5d illustrate simulated test results showing improvements in the operation of the 20T flip-flop in comparison to a conventional standard cell flip-flop.

For the comparison demonstrated in FIGS. 5b-5d, the 20T flip-flop was compared with a 65 nm ARM® standard-cell tri-state gate flip-flop (TGFF) for different operating conditions (e.g. TT=typical, SS=Slow, FF=Fast; 25 C, 0 C and 85 C denote temperatures in degrees Celsius; and 1p2, 0p9 and 1p3 denote voltages (1.2V, 0.9V and 1.3V respectively)). The TGFF was resized to have minimum width for the NMOS transistors (0.2 µm) and 1.75× minimum width for the PMOS transistors (0.35 µm), and the 20T flip-flop was then sized to have a matching D-Q delay.

The clock energy (Eck), data energy (Edt) and clock driver energy (Ecdrv) were measured, Ecdrv being measured as the integral of the power consumed by the final clock driver before the flip-flop.

As shown in the simulated test results, the clock energy (Eck) of the 20T flip-flop (shown by bars 80) is reduced in comparison the clock energy of the TGFF flip-flop (shown by bars 82).

Furthermore, the data energy (Edt) of the 20T flip-flop (shown by bars 84) is reduced in comparison the data energy of the TGFF flip-flop (shown by bars 86).

Furthermore still, the clock-driver energy (Ecdrv) of the 20T flip-flop (shown by bars 88) is reduced in comparison the data energy of the TGFF flip-flop (shown by bars 90).

Even furthermore still, the reduced transistor count for the 20T flip-flop provides for a reduced chip size for the 20T flip-flop (shown by bar 92) in comparison to the TGFF (shown by bar 94), whereby the 20T requires approximately 77% of the TGFF area.

FIG. 6a schematically illustrates flip-flop 200 according to a further embodiment; FIG. 6b is a timing diagram for the flip-flop 200. Flip-flop 200, has a substantially similar operation and configuration to the flip-flops described above, wherein the flip-flop 200 provides slave-retention functionality.

In the present illustrative example flip-flop 200 comprises first voltage sources 30a and 30b and second voltage 31, whereby the first voltage source 30a comprises a switchable voltage source which may be on with respect to a conducting line(s)/circuit(s) (e.g. switched on or coupled thereto) or may be off with respect to a conducting line(s)/circuit(s) (e.g. switched off or decoupled therefrom), whilst first voltage source 30b comprises a fixed or 'always on' voltage with respect to a conducting line(s)/circuit(s).

Flip-flop 200 also comprises a retention input 202 with additional NMOS transistor (M21a) arranged in series with the local clock buffer 10, the gate of which is controlled responsive to a retention signal (nRTN).

A PMOS transistor (M22a), the gate of which is controlled responsive to the retention signal (nRTN), arranged between the fixed power supply 30b and node 203 on the inverted clock signal (nck) line between the output of local clock buffer 10 and the gate of transistor (M07).

It will be appreciated that the transistors (M01, M02, M21a & M22a) are arranged to provide the functionality of a NAND logic gate, clock input 6 providing a first input and the retention signal providing a second input.

The configuration provides that the clock signal (ck) can be held low (i.e. not toggled) and master latch 3 can be substantially powered down, whereby the state in the slave latch 4, will be retained with the back-to-back inverters 70 & 22 being powered by the fixed power supply 30b.

When the retention signal (nRTN) is pulled low, the NMOS transistor (M21a) turns off, such that the local clock buffer has no discharge path to ground through transistor (M21a).

However, PMOS transistor (M22a) is turned on in response to a low retention signal (nRTN), which pulls node 203 high to the first voltage 30b, which turns NMOS transistor (M07) on, thereby providing transistor (M16) with a discharge path to ground, required for the slave latch 3 to retain state, as described at FIG. 4a and FIG. 4b above.

Furthermore, it will be seen that the clock inverter signal (nck) being high turns PMOS transistor (M08) off such that there is no discharge/leakage path between transistor (M13) and transistors (M04)

In operation, and with reference to the timing diagram of FIG. 6b, the clock signal (ck) is held low (as at 204), and the retention signal (nRTN), which may be generated external to the flip-flop (e.g. from a processor or power management unit) is also held low (as at 206), after which the switched power supply (30b) may be off e.g. switched off, decoupled or removed (as at 208) such that there is a zero output from the counter [3:0].

As is evident from the timing diagram, whereby the counter [3:0] retains the state [B] when the switched power supply 30b is returned (as at 210), such that the counter [3:0] continues counting from the state [B] after the retention signal (nRTN) returns high as at 212 and after the clock signal begins to toggle (as at 214).

Removing power from the master latch 3 means that the transistors in the master latch 3 will not toggle with the system clock, and so power consumption in the flip-flop 200 may be reduced in comparison to the flip-flops in which the transistors constantly toggle with the clock signal (ck).

Furthermore, the transistor configuration described in FIG. 3a is such that the retention functionality may be added thereto with the addition of only two additional transistors (M21a & M22a), whereby the flip-flop of FIG. 6a is a 22T flip-flop 200 having single-phase, fully-static, contention free operation with local clock buffering and retention functionality.

FIG. 7a schematically illustrates flip-flop 300 according to a further embodiment; and FIG. 7b is a timing diagram for the flip-flop 300. Flip-flop 300, has a similar configuration of transistors (M01-M20) to that of flip-flop 100 of FIG. 3a.

However, in the present illustrative example, conductor line 302 is electrically coupled between transistors (M07 & M15), whereby NMOS transistor M21b, controlled responsive to a reset signal (nR), is coupled between the electrical line 302 at node 301 and the second voltage 31. Transistor (M11) is also coupled to node 301.

Flip-flop 300 also comprises further additional transistors (M22b & M23), which in the present illustrative examples are PMOS transistors, controlled responsive to reset signal (nR).

Transistor (M22b) is arranged in series with transistor (M12) between the first voltage source 30 and conductor line 302, and further coupled to the output of the master latch 3 at node 304.

Transistor (M23) is coupled between the first voltage source 30 and conductor line 306 to which transistors (M14, M15 & M16) and the gates of transistors (M17 & M18) are also coupled.

During operation when no reset is required, the flip-flop 300 operates substantially as described above in relation to FIGS. 4a-4d, with reset signal (nR)=1 (high), whereby, as is evident from the timing diagram at FIG. 7b, the flip-flop 300 counts in response to clock signal (ck), outputting the incremental count value as shown at [3:0].

At some arbitrary time 310, (e.g. in response to a power event in the digital system) the reset signal (nR) transitions from high to low, and the flip-flop 300 stops counting, and the data (D) does not propagate to the output. When the reset signal (nR) returns high 312, the flip-flop will start counting from a predetermined value (e.g. zero).

The reset signal may be provided by any suitable source. For example, the reset signal (nR) may come from a power management unit following a power event on an associated processor, whereby after power-up the flip-flops are desired to be in a known state (e.g. 0). In other examples, the reset signal (nR) may be generated by another flip-flop (e.g. in a sequential design).

The configuration in FIG. 7a, and in particular the provision of conductor line 302 and transistor (M21b) means that the reset signal (nR) will not affect the state of transistor (M15) (e.g. due to de-transition) because when reset signal (nR) is low, transistor (M21b) is off so there is no leakage through transistor (M15).

Therefore, it will be seen that the addition of three transistors (M21b, M22b & M23) to the 20T configuration of FIG. 3a provides a 23T flip-flop having single-phase, fully-static, contention free operation with local clock buffering and an asynchronous reset functionality, whereby in the present illustrative example, the flip-flip comprises active-low reset functionality but is not limited in this respect.

The retention functionality described above may also be provided to flip-flop 300 by the addition of two further transistors as previously described in FIG. 7a.

FIG. 8a schematically illustrates flip-flop 400 according to a further embodiment and FIG. 8b is a timing diagram for the flip-flop 400.

Flip-flop 400 has transistors (M01-M18), arranged in a master latch 3 and slave latch 4 configuration, having a similar operation to that of flip-flop 100 of FIG. 3a.

However, flip-flop 400 does not have any local-clock buffering functionality, and, therefore, the operation of transistors (M01, M06 & M10) are controlled in accordance with the clock signal (ck) and not by a buffered clock signal (nck) as previously described.

As will be also appreciated, the configuration of transistors (M01-M18) of flip-flop 400 is modified to take account of the removal of the clock buffer. An illustrative example of such modification, the transistors controlled responsive to the data (D) (i.e. transistors (M02 & M04)) are coupled in series between the second voltage 31 and the transistor (M01).

By removing the local clock buffer from the flip-flop, the transistor count is reduced by two to 18T, and so the chip area and transistor capacitance may be reduced in comparison to the 20T.

As is evident from the timing diagram at FIG. 8b, the flip-flop 400 continues operating, (counting in response to clock signal (ck) being toggled), outputting the incremental count value as q[3:0].

Whilst the example configurations set out above generally relate to D-type flip-flops, the claimed subject matter is not limited in this regard and one skilled in the art will recognize that the techniques are equally applicable to other types of flip-flops such as JK flip-flops, and set-reset (SR) flip-flops amongst others.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As will be appreciated from the foregoing specification, techniques are described providing flip-flops having a master latch having first and second circuits to and a slave latch comprising a third circuit, whereby the flip-flop may provide single phase, static, contention free operation.

An output of the second circuit may be provided as an input to the first circuit. Furthermore, the slave latch may comprise a fourth circuit to invert the slave output signal to generate the inverted slave output signal during the first portion of the first clock signal and wherein the slave latch may comprise a fifth circuit to invert the slave output signal to generate a flip-flop output signal during the second portion of the first clock signal, and wherein the master latch may comprise a sixth circuit to generate the first clock signal in response to a second clock signal.

The master latch signal may be the complement of the input signal. Additionally or alternatively, the first master logic operation or first slave logic operation may comprise an AND and OR operation and the second master logic operation may comprise an OR operation.

One or both of the first circuit and third circuit may comprise a compound logic gate, wherein first master operation and first slave operation may comprise an AND-NOR operation or an OR-NAND operation.

The first circuit may comprise a first plurality of switch elements, wherein the second circuit may comprise a second plurality of switch elements, and the third circuit may comprise a third plurality of switch elements. In certain embodiments, the first circuit and the third circuit may share a switch element.

The fourth circuit may comprise a fourth plurality of switch elements, the fifth circuit may comprise a fifth plurality of switch elements and the 13 and the sixth circuit may comprise a sixth plurality of switch elements. In certain embodiments, the third plurality of switch elements and fourth plurality of switch elements may operate as a latch during the first portion of the first clock signal. Additionally, or alternatively, the fourth and fifth plurality of switch elements may be controlled in response to an output of the third circuit.

The sixth plurality of switch elements may be arranged in an inverter configuration to invert the second clock signal, wherein the flip-flop comprises twenty switch elements.

In a further embodiment, the sixth plurality of switch elements may be arranged to provide a NAND operation, and wherein the first clock signal is generated in response to the second clock signal and a retention signal.

The first voltage source may comprise a fixed source and a switchable source, wherein the first plurality of switch elements and the second plurality of switch elements are coupled to the switchable source, wherein the third and fourth plurality of switch elements are coupled to the fixed source, and wherein the flip-flop retains the slave latch signal when the first voltage source is off, and wherein the flip-flop comprises twenty-two switch elements.

Additionally or alternatively, the first plurality of switch elements, second plurality of switch elements and third plurality of switch elements are coupled to the second voltage via a first reset switch element, wherein the third circuit further comprises a second reset switch element and wherein the fourth circuit further comprises a third reset switch element and wherein the first, second and third reset switch elements are controlled responsive to a reset signal to reset the flip-flop output to a predetermined value, wherein the flip-flop comprises twenty three switch elements.

In some embodiments, the flip-flop may comprise eighteen switch elements.

While there has been illustrated and described what are presently considered to be example features, it will be understood by those skilled in the art that various other modifications may be made, and equivalents may be substituted, without departing from the claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all embodiments falling within the scope of the appended claims, and equivalents thereof.

The invention claimed is:

1. A single-phase flip-flop comprising:
    a master latch comprising:
        a first circuit to generate a master latch signal in response to a first master logic operation on a flip flop input signal and a first clock signal, and a second circuit to generate a master output signal in response to a second master logic operation on the first clock signal and master latch signal;
    a slave latch comprising:
        a third circuit to generate a slave output signal in response to a first slave logic operation on the first clock signal and one of the master output signal and an inverted slave output signal;
    wherein the master latch is configured to capture the flip-flop input signal during a first portion of the first clock signal and the slave latch is configured to capture the master output signal during a second portion of the first clock signal; and
    wherein one or both of the first master logic operation and first slave logic operation comprise an AND and OR operation and wherein the second master logic operation comprises an OR operation.

2. The flip-flop of claim 1, wherein the slave latch comprises a fourth circuit to invert the slave output signal to generate the inverted slave output signal during the first portion of the first clock signal and wherein the slave latch comprises a fifth circuit to invert the slave output signal to generate a flip-flop output signal during the second portion of the first clock signal.

3. The flip-flop of claim 2, wherein the master latch comprises a sixth circuit to generate the first clock signal in response to a second clock signal.

4. The flip-flop of claim 3, wherein the first circuit comprises a first plurality of switch elements arranged between a first voltage source and a second voltage, wherein the second circuit comprises a second plurality of switch elements arranged between the first voltage source and the second voltage, and wherein the third circuit comprises a third plurality of switch elements arranged between the first voltage source and the second voltage.

5. The flip-flop of claim 4, wherein the first circuit and the third circuit share at least one switch element of the first plurality of switch elements and the third plurality of switch elements.

6. The flip-flop of claim 4, wherein the flip-flop comprises eighteen switch elements.

7. The flip-flop of claim 4, wherein the fourth circuit comprises a fourth plurality of switch elements arranged between the first voltage source and the second voltage.

8. The flip-flop of claim 7, wherein the third plurality of switch elements and the fourth plurality of switch elements operate as a latch during the first portion of the first clock signal.

9. The flip-flop of claim 7, wherein the fifth circuit comprise a fifth plurality of switch elements arranged between the first voltage source and the second voltage, wherein the fourth and fifth plurality of switch elements are controlled in response to an output of the third circuit.

10. The flip-flop of claim 9, wherein the sixth plurality of switch elements are arranged in an inverter configuration to invert the second clock signal.

11. The flip-flop of claim 9, wherein the sixth circuit comprises a sixth plurality of switch elements arranged between the first voltage source and a second voltage.

12. The flip-flop of claim 11, wherein the flip-flop comprises twenty switch elements.

13. The flip-flop of claim 11, wherein the sixth plurality of switch elements are arranged to provide a NAND operation, and wherein the first clock signal is generated in response to the second clock signal and a retention signal.

14. The flip-flop of claim 7, wherein the first voltage source comprises a fixed source and a switchable source, wherein the first plurality of switch elements and the second plurality of switch elements are coupled to the switchable source, wherein the third and fourth plurality of switch elements are coupled to the fixed source, and wherein the flip-flop is configured to retain the slave latch signal when the first voltage source is off.

15. The flip-flop of claim 7, wherein the first plurality of switch elements, second plurality of switch elements and third plurality of switch elements are coupled to the second voltage via a first reset switch element, wherein the third circuit further comprises a second reset switch element and wherein the fourth circuit further comprises a third reset switch element and wherein the first, second and third reset switch elements are controlled responsive to a reset signal to reset the flip-flop output to a predetermined value.

16. The flip-flop of claim 1, wherein the master latch signal is the complement of the input signal.

17. The flip-flop of claim 1, wherein one or both of the first circuit and third circuit comprise a compound logic gate.

18. The flip-flop of claim 1, wherein an output of the second circuit is provided as an input to the first circuit.

19. A digital system comprising a single phase flip-flop having:
   a master latch comprising:
      a first circuit to generate a master latch signal in response to a first master logic operation on a flip flop input signal and a first clock signal, and a second circuit to generate a master output signal in response to a second master logic operation on the first clock signal and master latch signal;
   a slave latch comprising:
      a third circuit to generate a slave output signal in response to a first slave logic operation on the first clock signal and one of the master output signal and an inverted slave output signal;
   wherein the master latch is configured to capture the flip-flop input signal during a first portion of the first clock signal and the slave latch is configured to capture the master output signal during a second portion of the first clock signal; and
   wherein one or both of the first master logic operation and first slave logic operation comprise an AND and OR operation and wherein the second master logic operation comprises an OR operation.

* * * * *